United States Patent [19]

Bianco

[11] Patent Number: 5,256,842
[45] Date of Patent: Oct. 26, 1993

[54] COVER FOR A SENSOR BUTTON

[76] Inventor: James S. Bianco, 217 Brainard Rd., Enfield, Conn. 06082

[21] Appl. No.: 905,443

[22] Filed: Jun. 29, 1992

[51] Int. Cl.⁵ ............................................. H01H 9/02
[52] U.S. Cl. .................................. 200/333; 200/61.59
[58] Field of Search .............. 200/43.01, 43.04, 43.05,
200/61.42, 61.59, 61.1, 511, 512, 293, 333;
341/20, 34; 178/18, 19, 20, 87; 439/482, 366,
519, 521, 912.1, 892, 893, 703, 705, 707, 271;
364/709.1, 409; 340/711, 712

[56] References Cited

U.S. PATENT DOCUMENTS

| | | | |
|---|---|---|---|
| 3,317,698 | 5/1967 | Mansfield | 200/333 |
| 3,676,750 | 7/1972 | Hawks | 200/61.59 X |
| 4,013,835 | 3/1977 | Eaclus et al. | 341/34 X |

FOREIGN PATENT DOCUMENTS 407119  3/1934  United Kingdom ................. 178/87

Primary Examiner—Henry J. Recla
Assistant Examiner—Glenn T. Barrett
Attorney, Agent, or Firm—John H. Crozier

[57] ABSTRACT

In a preferred embodiment, a cover for a sensor button having a shell portion and a touch zone on the upper surface of the sensor button, the cover comprising: an electrically conductive wall portion surrounding the shell portion; an electrically conductive upper portion attached to the wall portion and substantially overlying the upper surface of the sensor button; and an opening defined in the upper portion to expose a small portion of the touch zone, the opening being sized so as to accept therein a touch probe having a cylindrical shell with a contact disposed concentrically therein and extending from the end thereof.

5 Claims, 1 Drawing Sheet

COVER FOR A SENSOR BUTTON

BACKGROUND OF THE INVENTION

1. Field of the Invention

The present invention relates to sensor buttons generally and, more particularly, but not by way of limitation, to a novel protective cover for such sensor buttons which physically protects them and permits the convenient use of touch probes therewith.

2. Background Art

Touch sensors are thin disk-shaped electronic devices which may have data and/or identification information stored therein. Such sensors have found application in a variety of uses and are furnished, for example, by Dallas Semiconductor, Dallas, Tex.

One side of such a sensor presents a relatively large contact surface to which is temporarily touched a circular contact to read the stored information and/or to store information in the sensor disk.

One disadvantage of such sensor buttons is that, in some applications, they are subject to damage which renders them useless.

Another disadvantage of such sensor buttons is that they have little protection against static electricity because of the relatively large contact surface which can be touched easily by a human finger.

An additional disadvantage of such sensor buttons is that the information stored therein cannot be conveniently accessed with a touch probe such as furnished, for example, by Program Data Incorporated, Irvine, Calif.

Accordingly, it is a principal object of the present invention to provide a protective cover for a touch sensor that minimizes the possibility of damage to the touch sensor.

It is another object of the invention to provide such a cover that minimizes transfer of static electricity to the touch sensor.

It is a further object of the invention to provide such a cover that permits the touch sensor to be used with touch probes.

An additional object of the invention is to provide such a cover that is easily and economically constructed.

Other objects of the present invention, as well as particular features, elements, and advantages thereof, will be elucidated in, or be apparent from, the following description and the accompanying drawing figures.

SUMMARY OF THE INVENTION

The present invention achieves the above objects, among others by providing, in a preferred embodiment, a cover for a sensor button having a shell portion and a touch zone on the upper surface of said sensor button, said cover comprising: an electrically conductive wall portion surrounding said shell portion; an electrically conductive upper portion attached to said wall portion and substantially overlying said upper surface of said sensor button; and an opening defined in said upper portion to expose a small portion of said touch zone, said opening being sized so as to accept therein a touch probe having a cylindrical shell with a contact disposed concentrically therein and extending from the end thereof.

BRIEF DESCRIPTION OF THE DRAWING

Understanding of the present invention and the various aspects thereof will be facilitated by reference to the accompanying drawing figures, submitted for purposes of illustration only and not intended to define the scope of the invention, on which.

DETAILED DESCRIPTION OF THE PREFERRED EMBODIMENTS

Figure 1:
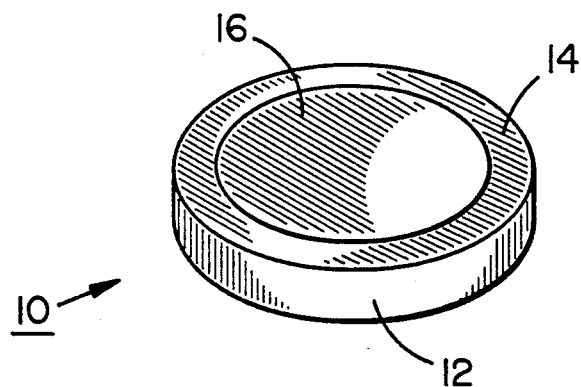
FIG. 1 is a perspective view of a conventional sensor button.

Reference should now be made to the drawing figures, on which similar or identical elements are given consistent identifying numerals throughout the various figures thereof.

FIG. 1 illustrates a typical sensor button, generally indicated by the reference numeral 10, which includes a metallic casing 12 with an integral annular rim portion 14 around the upper surface of the sensor button. The relatively large center portion 16 of the upper surface of sensor button 10 is electrically insulated from casing 12 and comprises a touch zone to which a relatively large cylindrical contact (not shown) may be temporarily attached to access information stored in the sensor button and/or to record information therein.

Figure 2:
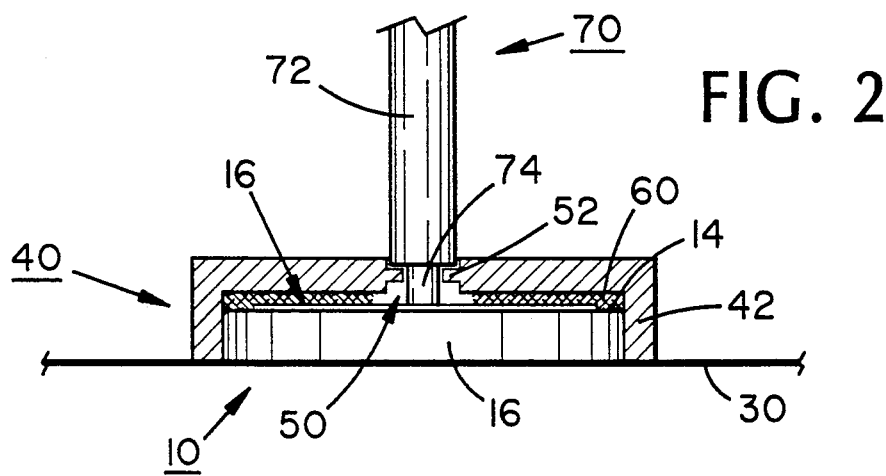
FIG. 2 is a side elevational view, partially in cross-section, of a sensor button with a protective cover according to the present invention with a touch probe in contact with the sensor button.
Figure 3:
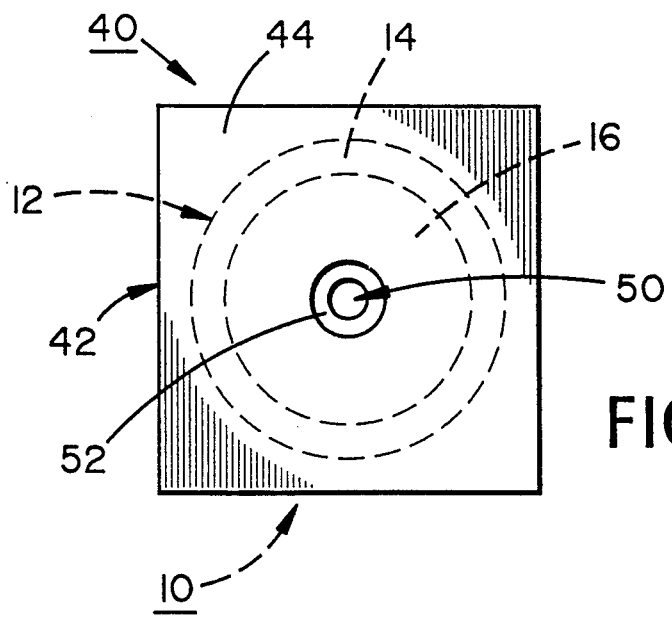
FIG. 3 is a top plan view of the sensor button and protective cover of FIG. 2.

FIGS. 2 and 3 illustrate sensor button 10 attached to a substrate 30 in any conventional manner, with a protective cover, generally indicated by the reference numeral 40, according to the present invention, disposed over the sensor button. Cover 40 includes an integral, electrically conductive wall portion 42 surrounding casing 12 and in electrical engagement therewith. Cover 40 further includes an electrically conductive upper portion 44 attached to wall portion 42 which substantially overlies the upper surface of sensor button 10. Defined centrally in said upper portion 44 is a circular opening 50 exposing a small portion of the center of touch zone 16 of the sensor button. Formed around the periphery of circular opening 50 is an inwardly facing annular flange 52. A dielectric material 60 is disposed between the upper surface of sensor button 10 and the inner surface of upper portion 44 of cover 40. Cover 40 may be constructed of a strong metallic material and may be attached to sensor button 10 by any conventional means such as with a suitable adhesive. Cover 40 may also be independently attached to substrate 30 by any suitable means.

FIG. 2 also illustrates an conventional touch probe, generally indicated by a reference numeral 70, which includes an electrically conductive outer shell 72 and disposed concentrically within said outer shell is a spring-loaded contact 74 extending from the end of the shell. Probe 70 has been inserted in circular opening 50 such that the inner periphery of the opening centers outer shell 72. With outer shell 72 so positioned, contact 74 extends through the opening defined by annular flange 52 without contact therewith so that it is in electrical contact with touch zone 16. At the same time, outer shell 72 is in electrical contact with annular flanqe 52. So inserted, touch probe 70 may be employed, in a conventional manner, to access information stored in sensor button 10 and/or to store information therein.

It can be seen that cover 40 provides substantial physical protection for sensor button 10.

Also, cover 40 can be employed to increase the bonding area to substrate 30.

Additionally, cover 40 adapts sensor button 10 to be conveniently read by touch probe 70.

Further, cover 40 provides static electricity protection, since a human finger will touch the grounded upper portion 44 without being able to contact touch zone 16.

It will thus be seen that the objects set forth above, among those elucidated in, or made apparent from, the preceding description, are efficiently attained and, since certain changes may be made in the above construction without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention which, as a matter of language, might be said to fall therebetween.

I claim:

1. A cover for a sensor button having a shell portion and a touch zone on an upper surface of said sensor button, said cover comprising:

(a) an electrically conductive wall portion surrounding said shell portion;
    (b) an electrically conductive upper portion attached to said wall portion and substantially overlying said upper surface of said sensor button; and
    (c) an opening defined in said upper portion to expose a small portion of said touch zone, said opening being sized so as to accept therein a touch probe having a cylindrical shell with a contact disposed concentrically therein and extending from an end thereof.

2. A cover for a sensor button, as defined in claim 1, further comprising: an inwardly facing flange formed around a periphery of said opening, such that when said touch probe is inserted in said opening, said cylindrical shell will engage said flange and said contact will extend past said flange without contact therewith to electrically engage said touch zone.

3. A cover for a sensor button, as defined in claim 1, wherein said wall of said cover is in electrical engagement with said shell of said sensor button.

4. A cover for a sensor button, as defined in claim 1, further comprising: a dielectric material disposed between said upper portion of said cover and said touch zone.

5. A cover for a sensor button, as defined in claim 1, wherein said cover is attached to a substrate to which said sensor button is attached.

* * * * *